LOW VOLTAGE AVALANCHE PROCESS

Filed May 16, 1967 3 Sheets-Sheet 1

INVENTOR.
HENRY MACK QUEEN,
By His Attorneys Spensley & Horn

Sept. 2, 1969 H. M. QUEEN 3,464,867

LOW VOLTAGE AVALANCHE PROCESS

Filed May 16, 1967 3 Sheets-Sheet 2

INVENTOR.
HENRY MACK QUEEN,
By His Attorneys
Spensley & Horn

Sept. 2, 1969 H. M. QUEEN 3,464,867

LOW VOLTAGE AVALANCHE PROCESS

Filed May 16, 1967 3 Sheets-Sheet 3

INVENTOR.
HENRY MACK QUEEN,
By HIS ATTORNEYS.
Spensley & Horn.

United States Patent Office 3,464,867

Patented Sept. 2, 1969

3,464,867

LOW VOLTAGE AVALANCHE PROCESS

Henry Mack Queen, Manhattan Beach, Calif., assignor to TRW Semiconductors, Inc., Lawndale, Calif., a corporation of Delaware Filed May 16, 1967, Ser. No. 638,938
Int. Cl. H01l 7/34
U.S. Cl. 148—181 7 Claims

ABSTRACT OF THE DISCLOSURE

The method of manufacturing an alloyed semiconductor diode whereby field emission conduction phenomena are reduced at low reverse voltages including the steps of alloying an active impurity into a semiconductor body at a temperature above the impurity-semiconductor eutectic, cooling the semiconductor body to a temperature below the impurity-semiconductor eutectic, reheating the alloyed semiconductor body to a temperature above 900° C., followed by a rapid cooling to a temperature below the impurity-semiconductor eutectic.

BACKGROUND OF THE INVENTION

Field of the invention

The present invention relates to the method of manufacturing semiconductive diodes and more particularly to the method of manufacturing alloyed, low reverse breakdown voltage semiconductor diodes having improved electrical characteristics.

Description of the prior art

The utilization of the breakdown phenomena of semiconductor diodes in various electronic applications is well known. Where utilized, it has been found most desirable that a given diode provide sharp breakdown with low dynamic impedance and low reverse leakage.

The principal method employed heretofore in forming semiconductor diode devices for use in low voltage applications, although of some variation, basically followed the steps of placing a P-type impurity source in contact with an N-type semiconductor crystal body and heating the same above the eutectic temperature of the materials chosen but below 900° C. to cause an alloyed P-N junction to be formed. While adaptable for use in low voltage applications where diffused junction devices are not, it has long been known that the alloyed devices so produced possess the undesirable breakdown characteristics of high dynamic impedance and high reverse leakage which adversely limit the efficiency of such devices. Attempts have been made to improve the breakdown characteristics or alloyed devices, but such attempts have been singularly unsuccessful. Until the present invention was conceived, there had been no way to achieve a repeatable and consistent alloy geometry with forming temperatures in excess of 900° C. The previous attempts, though producing somewhat improved breakdown characteristics, also alter the junction geometry, causing undesirable effects which preclude the use of such devices in low voltage applications.

The present invention improves the breakdown characteristics of semiconductor diode devices designed for use in low voltage (3.9 to 11.0 volts) applications, while producing a repeatable and consistent alloy geometry.

SUMMARY OF THE INVENTION

The present invention is a method of manufacturing an alloyed semiconductor diode which includes the steps of alloying at least one active impurity into a semiconductor crystal body to form a P-N junction in said crystal body, subjecting said alloyed body to an elevated temperature in excess of 900° C., and rapidly cooling said alloyed body to a temperature below the eutectic temperature of the materials chosen.

The present invention greatly improves the breakdown characteristics of low voltage alloyed semiconductor diodes. The dynamic impedance and reverse leakage characteristics of such diodes are many times reduced as will be shown hereinafter. Further, the present invention enables manufacture of such devices with a repeatable and consistent alloy geometry.

Accordingly, it is an object of the present invention to provide an improved method of manufacturing alloyed semiconductor diodes.

It is a further object of the present invention to provide an improved method of manufacturing a low voltage, alloyed semiconductor diode having improved breakdown characteristics.

Yet another object of the present invention is to provide an improved high temperature method of manufacturing low voltage alloyed diodes which produces a repeatable and consistent alloy geometry.

The novel features which are considered to be characteristic of the present invention, together with further objects and advantages thereof, will be better understood from the following description in which the invention is illustrated by way of example. It is expressly understood, however, that the description is for the purpose of illustration only and that the true spirit and scope of the invention is defined by the accompanying claims.

DESCRIPTION OF THE PREFERRED EMBODIMENT

Figure 1:
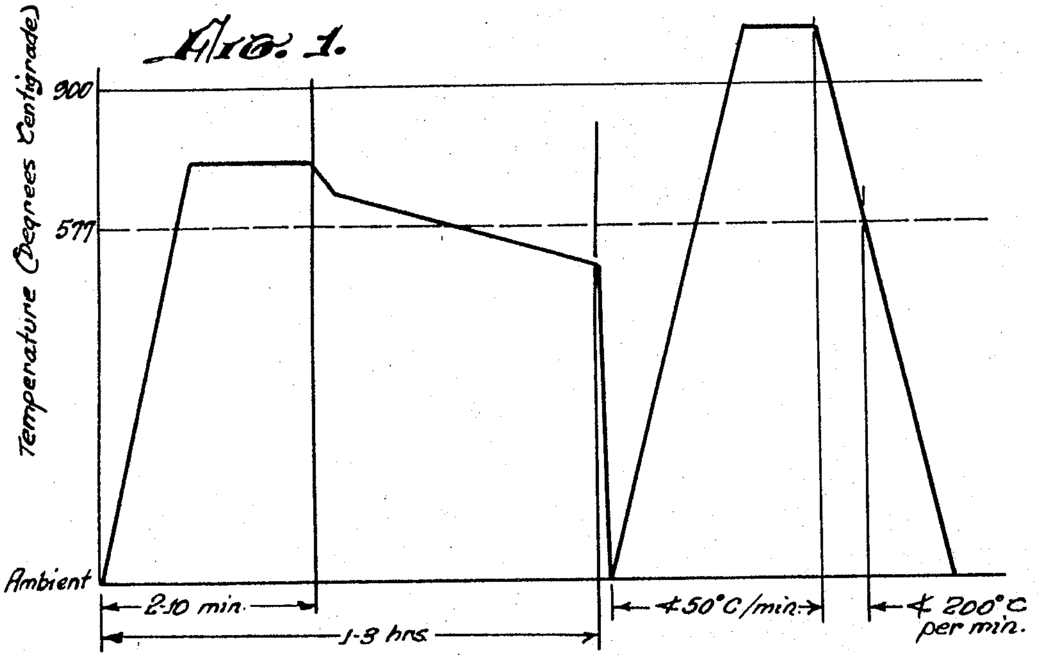
FIGURE 1 is a plot of junction formation temperature against junction formation time for a typical cycle of the present invention together with partial overlays indicative of other possible combinations.

Referring now to the drawing, and particularly to FIGURE 1, a source of active P-type impurity, which may be a sphere, wire, or section of aluminum foil, is placed in contact with a wafer or die of N-type semiconductor material which may be silicon. The impurity source and semiconductive body are placed in a closed oven and rapidly heated to a temperature above the eutectic temperature of the materials chosen and below 900° C. As an illustration of the description contained herein, the values chosen for FIGURE 1 are representative figures for a process employing aluminum and silicon. Such heating is followed by cooling the materials to a temperature below the eutectic temperature of the materials chosen at a rate not to exceed 25° C. per minute for 1–3 hours, whereby an alloyed P-N junction is formed in the semiconductive wafer. It is considered that a maximum rate of heating followed by cooling as described will maximize the perfection of the alloying geometry and preclude undesirable internal crystal pressures and cracking. Thereafter, unspecified cooling to the ambient temperature may be effected. While the preceding steps are helpful in forming the desired alloy junction, it is to be understood that the following described steps may be carried out without effecting the cooling steps previously described.

Following formation of the alloy junction, any of the impurity source remaining exterior of the alloyed body is removed so as to prevent further spreading, or poolings, of the impurity region.

The alloyed body is then introduced into a closed oven and heated to an elevated temperature in excess of 900° C., but less than the melting temperature of the semiconductive material used at a rate of at least 50° C. per minute. After such reheating, the alloyed body is removed to an opened end of the oven and cooled to a temperature below the eutectic temperature of the materials used at a rate of at least 200° C. per minute.

Thereafter, any number of stept known in the art may be employed to metallize surfaces or attach electrical leads to complete the diode package.

If desired, all of the above heating and cooling steps may be performed in an oxygen free atmosphere to avoid surface oxidation.

Figures 2, 4:
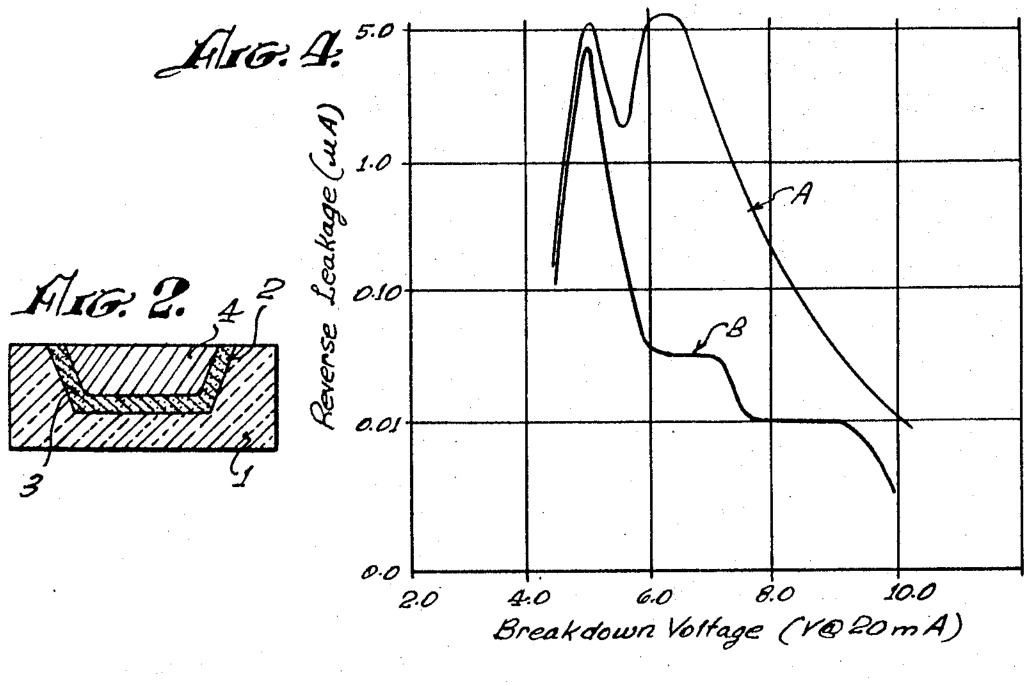
FIGURE 2 is a cross section of a device produced by the present invention.
FIGURE 4 is a plot of reverse leakage current against breakdown voltage contrasting low voltage devices produced by heretofore known alloying methods and the present invention.

Referring now to FIGURE 2, it is seen that the above described process produces a diode configuration having a silicon body or base 1, a thin, high impurity density P-N junction 2, a regrown region 3 comprised of aluminum doped silicon, and a concentration of aluminum 4. The body thus produced may be diced into individual diodes, if necessary, depending upon the semiconductive material configuration originally chosen for processing; etched or lapped as necessary to achieve desired operating characteristics, such methods not being claimed herein.

The diode device thus produced is far superior to any produced by previously known methods. As indicated hereinbefore, and in FIGURE 2, despite heating above 900° C., the geometry of the junction formed has remained characteristically an alloyed junction of high impurity density thereby permitting improved breakdown at applied voltages of from 3.9 to 11.0 volts.

More importantly, many low voltage diode applications depend upon the breakdown characteristics of such a device for their efficient operation. As an illustration, the efficiency of an alloyed low voltage diode used for low voltage regulation depends largely upon the dynamic impedance or the device used. An equation which is used to describe the performance of low voltage dynamic regulator circuits considers only the dynamic impedance of the diode and the circuit constants:

$$\frac{V_{out}}{V_{in}}=\frac{1}{\frac{R_S}{R_L}+\frac{R_S}{Z_Z}+1}$$

Where $R_S$=series dropping resistance;

$R_L$=load resistance; and $Z_Z$=dynamic impedance of the diode device, and, the relationship $V_{out}/V_{in}$ is representative of the change in output voltage per unit of input voltage.

Figure 3:
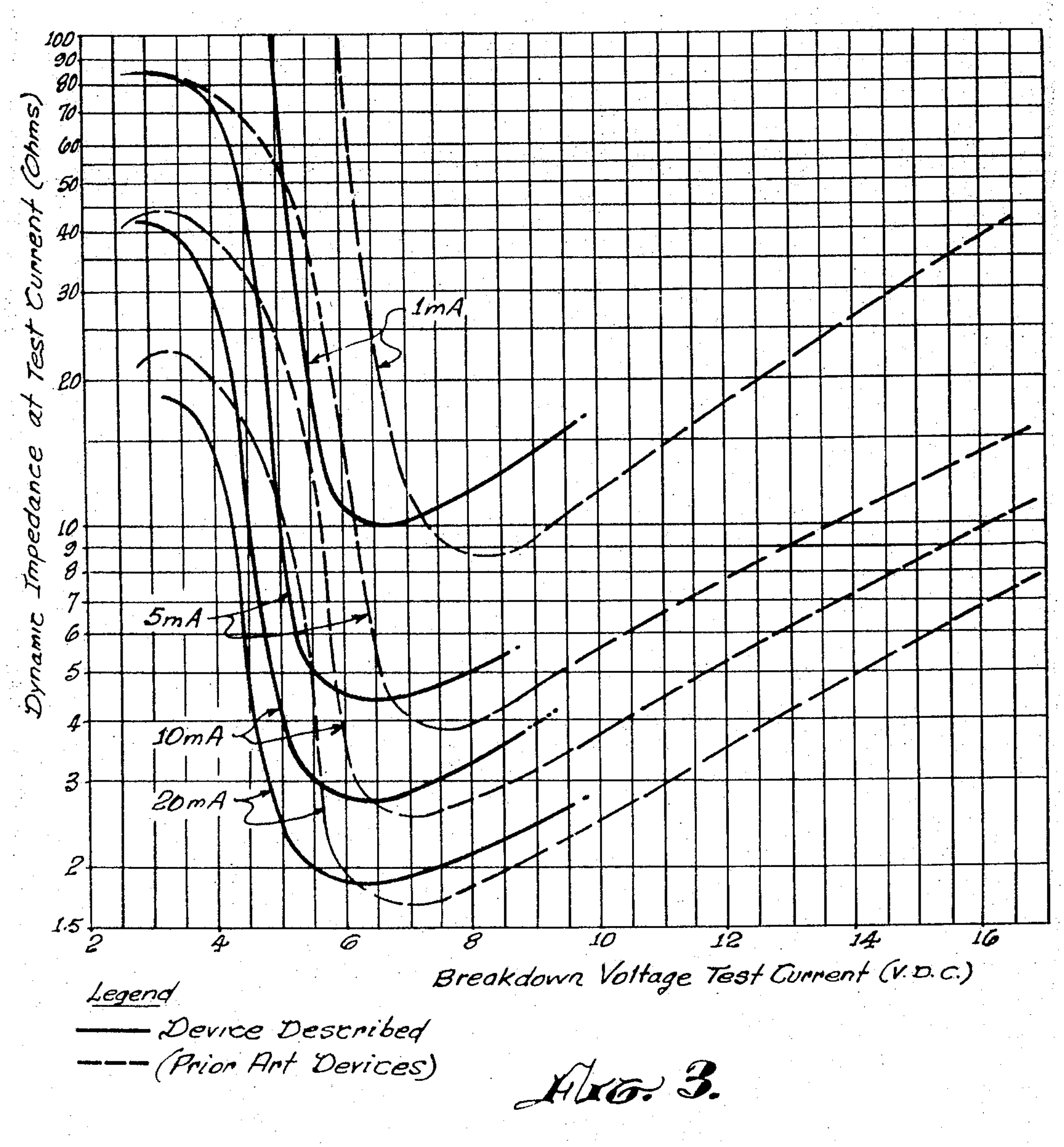
FIGURE 3 is a plot of dynamic impedance at test current against breakdown voltage for typical devices produced by heretofore known alloying methods as compared with the present invention.

It is readily seen that where the dynamic impedance is low, the performance of the circuit is maximized. Referring now to FIGURE 3, there is shown a family of curves contrasting the improved impedance characteristics of a typical device produced by the present invention with the impedance characteristics of a typical low voltage device produced by heretofore known methods. It is seen that for a given applied voltage, dynamic impedance may be reduced by as much as a factor of ten (10).

While in the normal application of the low voltage alloyed diode to regulator circuits the diode is biased into breakdown at all times and used as a source of constant voltage, in other applications of the same device, such as over- and under-voltage protection and metering applications, the diode is switched in and out of breakdown. These applications place different demands on the diode performance. A diode with low reverse junction leakage and sharp breakdown is most desirable since behaviour in the pre-breakdown region is critical. Referring now to FIGURE 4. Curve A represents the reverse leakage current characteristic of representative devices produced by methods previously known. Curve B represents the same characteristics of representative devices produced by the present invention. Clearly, the reverse leakage characteristic is dramatically improved over a wide range of low voltage applications.

Figure 6:
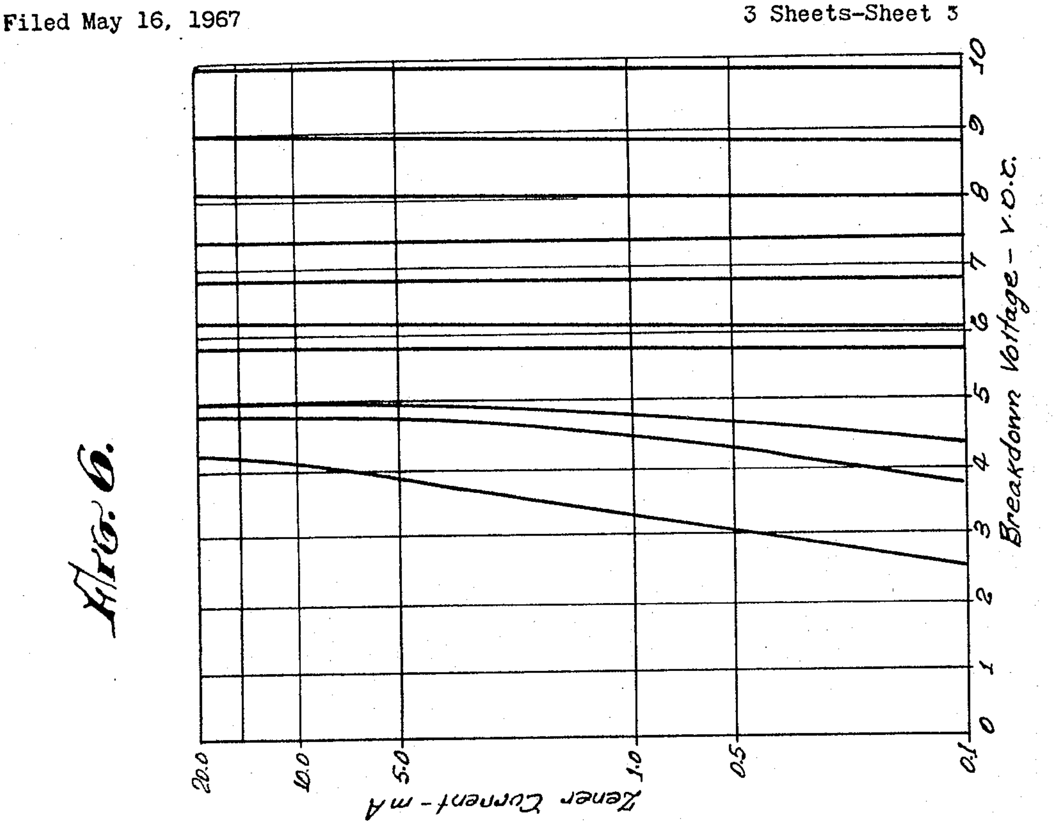
FIGURE 6 is a plot of Zener current against breakdown voltage for a typical selection of devices produced by the present invention.
Figure 5:
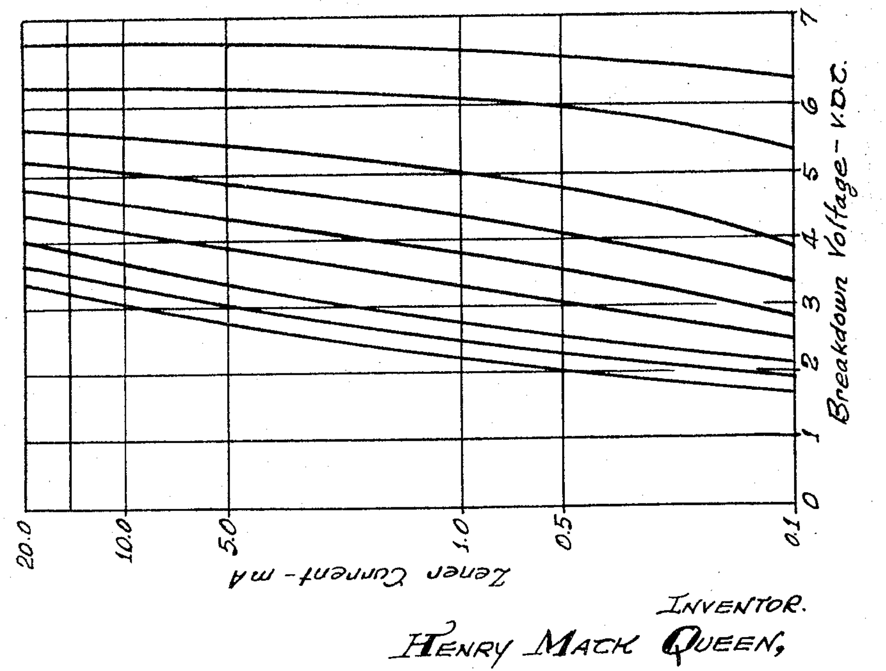
FIGURE 5 is a plot of Zener current against breakdown voltage for typical low voltage devices produced by heretofore known alloying methods.

Referring now to FIGURE 5 and FIGURE 6, there is graphically depicted the improvement in electrical characteristics of alloyed low voltage devices produced by the present invention. FIGURE 5 indicates the soft breakdowns representative of low voltage alloyed diodes produced by previously known methods. FIGURE 6 demonstrates the sharply delineated breakdowns of devices produced by the present invention under the same test conditions.

There has thus been described an improved method of manufacturing low voltage alloyed diodes which minimizes the effects of low voltage junction conduction phenomena. The devices produced by the present invention are characterized by sharp breakdowns which result in vastly improved reverse leakage and dynamic impedance characteristics over devices produced by previously known methods while having repeatably consistent alloyed geometries.

What is claimed is:

1. The method of manufacture of an alloyed semiconductive diode including the steps of:
   - (a) alloying at least one active impurity into a semiconductive crystal body to form a P-N junction in said crystal body;
   - (b) heating said alloyed body to an elevated temperature in excess of 900° C.; and
   - (c) rapidly cooling said alloyed body from said elevated temperature at a rate of at least 200° C. per minute to a temperature below the eutectic temperature of the materials chosen.

2. The method recited in claim 1, wherein said alloyed body is heated to said elevated temperature at a rate of at least 50° C. per minute in an oxygen free atmosphere.

3. The method of manufacture of an alloyed semiconductive diode including the steps of:
   - (a) placing a predetermined amount of aluminum in contact with a silicon body in a closed container;
   - (b) heating said body to a temperature sufficient to form an alloyed P-N junction;
   - (c) further heating said body to a temperature in excess of 900° C. at a rate of at least 50° C. per minute; and
   - (d) cooling said body to a temperature below the eutectic temperature of aluminum and silicon at a rate of at least 200° C. per minute.

4. The method of manufacture of an alloyed semiconductive diode including the steps of:
   - (a) placing a source of aluminum in contact with a silicon body in a closed container;
   - (b) heating said body to a temperature sufficient to form an alloyed P-N junction;
   - (c) cooling said body to a temperature below the eutectic temperature of aluminum and silicon;
   - (d) removing excess aluminum exterior of said body;
   - (e) further heating said body to a temperature in excess of 900° C. at a rate of at least 50° C. per minute; and (f) cooling said body to a temperature below the eutectic temperature of aluminum and silicon at a rate of at least 200° C. per minute.

5. In a prealloyed semiconductive diode including a P-N junction, the method of minimizing the effects of field emission conduction phenomena in said diode including the steps of:

(a) heating said diode to an elevated temperature in excess of 900° C.; and (b) cooling said diode to a temperature below the eutectic temperature of the materials chosen for said diode at a rate of at least 200° C. per minute.

6. In the process of manufacturing an alloyed semiconductive diode body wherein said body is heated to a temperature above the eutectic temperature of a source of an active impurity and a semiconductive crystal body but lower than 900° C. whereby there is formed an alloyed P-N junction in said body, the method of minimizing the effects of field emission conduction phenomena in said body including the subsequent steps of:

(a) heating said alloyed body to an elevated temperature in excess of 900° C. and below the melting temperature of said crystal body; and (b) cooling said alloyed body from said elevated temperature to a temperature below said eutectic temperature at a rate of at least 200° C. per minute.

7. In the process of manufacturing an alloyed semiconductive diode, the method of minimizing the effects of field emission conduction phenomena in said diode including the steps of:

(a) placing an aluminum body in contact with a silicon body in a closed, oxygen-free container;

(b) heating said aluminum and said silicon at a rapid rate to a temperature above the silicon-aluminum eutectic temperature and below 900° C. whereby the aluminum is alloyed with that portion of said silicon contiguous therewith to form a P-N junction;

(c) removal of the excess aluminum source;

(d) introduction of said alloyed body into a first portion of an oxygen-free container wherein said body is heated to an elevated temperature in excess of 900° C. at a rate of at least 50° C. per minute; and (e) removing said alloyed body to a second portion of said container opened to the ambient atmosphere whereat said body is cooled to a temperature below said eutectic temperature at a rate of at least 200° C. per minute.

References Cited

UNITED STATES PATENTS 3,143,443 8/1964 Maserjian ---------- 148—181

RICHARD O. DEAN, Primary Examiner

U.S. Cl. X.R.

148—185